(12) United States Patent
Singh et al.

(10) Patent No.: US 10,148,277 B1
(45) Date of Patent: Dec. 4, 2018

(54) CURRENT STEERING DIGITAL TO ANALOG CONVERTER WITH DECODER FREE QUAD SWITCHING

(71) Applicant: STMicroelectronics International N.V., Schiphol (NL)

(72) Inventors: Pratap Narayan Singh, Chahania Chandauli (IN); Vivek Tripathi, Allahabad (IN); Anil Kumar, Greater Noida (IN); Rakesh Malik, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/600,152

(22) Filed: May 19, 2017

(51) Int. Cl.
   *H03M 1/08* (2006.01)
   *H03M 1/66* (2006.01)
   *H03M 1/74* (2006.01)
   *H03M 1/06* (2006.01)

(52) U.S. Cl.
   CPC ....... *H03M 1/0872* (2013.01); *H03M 1/0663* (2013.01); *H03M 1/66* (2013.01); *H03M 1/742* (2013.01)

(58) Field of Classification Search
   USPC ......................................... 341/136
   See application file for complete search history.

(56) References Cited

U.S. PATENT DOCUMENTS

| | | | | |
|---|---|---|---|---|
| 4,405,916 A * | 9/1983 | Hornak | ................... | H03M 1/06 341/118 |
| 6,768,438 B1 | 7/2004 | Schofield et al. | | |
| 6,842,132 B2 * | 1/2005 | Schafferer | ............. | H03M 1/068 341/136 |
| 7,158,062 B2 * | 1/2007 | Cosand | ................. | H03M 3/376 341/133 |
| 7,436,340 B2 * | 10/2008 | Sasaki | ................. | H03K 17/162 341/136 |
| 7,973,687 B2 * | 7/2011 | Ikoma | ................. | H03M 1/0682 341/136 |

(Continued)

FOREIGN PATENT DOCUMENTS

EP     0221290 A2 *   5/1987  .......... H03M 1/0818

OTHER PUBLICATIONS

Liu, M. et al., A High-SFDR 14-bit 500 MS/s Current-Steering D/A Converter in 0.18 μm CMOS, IEEE Transactions on Very Large Scale Integration (VLSI) Systems, vol. 23, No. 12, Dec. 2015.*

(Continued)

*Primary Examiner* — Howard Williams
(74) *Attorney, Agent, or Firm* — Crowe & Dunlevy

(57) ABSTRACT

Disclosed herein is a digital to analog converter including a first dynamic latch receiving a data signal and an inverse of the data signal. The first dynamic latch is clocked by a clock signal and configured to generate first and second quad switching control signals as a function of the data signal and the inverse of the data signal. A second dynamic latch receives the data signal and the inverse of the data signal, is clocked by an inverse of the clock signal, and is configured to generate third and fourth quad switching control signals as a function of the data signal and the inverse of the data signal. A quad switching bit cell is configured to generate an analog representation of the data signal as a function of the first, second, third, and fourth quad switching signals.

15 Claims, 4 Drawing Sheets

(56) References Cited

U.S. PATENT DOCUMENTS 8,462,034 B2 * 6/2013 Santos ............... H03M 1/0624
327/144
8,730,404 B2 * 5/2014 Daigle ............. H03K 3/356191
327/115

OTHER PUBLICATIONS

Razavi, B. The StrongARM Latch, IEEE Soltid State Circuits Magazine, Spring 2015 vol. 7 No. 2, Jun. 2015.*
Le Tual, et al., "A 3GS/s, 9b, 1.2 V single supply, pure binary DAC with> 50dB SFDR up to 1.5 GHz in 65nm CMOS" ,2011 Symposium on VLSI Circuits (VLSIC), pp. 64-65.
Park, S., et al, "A Digital-to-Analog Converter Based on Differential-Quad Switching", IEEE Journal of Solid-State Circuits, vol. 37, No. 10, Oct. 2002 (4 pages).

* cited by examiner

US 10,148,277 B1

CURRENT STEERING DIGITAL TO ANALOG CONVERTER WITH DECODER FREE QUAD SWITCHING

TECHNICAL FIELD

The present disclosure relates to a high-speed digital to analog converter, and more specifically, to a current steering digital to analog converter utilizing decoder free quad switching.

BACKGROUND

High-speed and high-accuracy digital to analog converts (DACs) are important building blocks for many signal processing and telecommunication systems. A DAC is a device that converts a digital signal into an analog signal. Due to the ever increasing digital processing power and speed of modern chips, the need for DACs with higher sampling speeds is on the rise. For example, 3D high-definition televisions (HDTVs) use DACs with 200 Mega-samples per second (MSPS) while telecommunication transmitters use DACs with over a few GSPS. In addition to the high sampling speed, many of these applications also require very high linearity and high Spurious-Free Dynamic Range (SFDR) in the output analog signal.

Generally DACs use multiple switches to steer current to one or multiple outputs. The switches are operated by digital signals generated by a chain of digital signal processing. As the switches are turned on or off by the digital signals, jitter in the digital signals to the switches may degrade linearity performance and add spurious noises at the analog output. With high-speed DACs, the situation is especially critical since jitter at the digital signals tends to cause a more pronounced effect as the frequency increases.

Another important factor in high-speed DACs is data dependent switching of switches. Data dependent switching can be caused partly due to the asymmetry in the beginning transition and ending transition of an "on" pulse (e.g., "1" pulse) and an "off" pulse (e.g., "0" pulse). Generally, the transition time for turning on the pulse and turning off the pulse are asymmetric. Due to such differences in transition time, data streams including combinations of "on" pulses and "off" pulses generate noise in the analog output of the DACs that is dependent on digital signals provided to the DACs. This results in formation of switching power from the power supply. This switching power, when interacting with package parasitic like bonding or routing inductances, can generate harmonics of the desired signal from power supply to outputs and can further degrade the SFDR and SNR of the DAC.

Further development in the area of DACs is therefore needed to address these issues.

SUMMARY

Disclosed herein is a digital to analog converter including a first differential latch with reset input, receiving a data signal and an inverse of the data signal and with complementary outputs when not in reset state. Reset state will have same value of both outputs. One example for this kind of latch is the dynamic latch. However, there are many other derivatives of the latch which can be used to same functionality. For simplicity any future description will use Strong ARM dynamic latch as an example. The first dynamic latch is clocked by a clock signal and configured to generate first and second quad switching control signals as a function of the data signal and the inverse of the data signal. A second dynamic latch receives the data signal and the inverse of the data signal, is clocked by an inverse of the clock signal, and is configured to generate third and fourth quad switching control signals as a function of the data signal and the inverse of the data signal. A quad switching bit cell is configured to generate an analog representation of the data signal as a function of the first, second, third, and fourth quad switching signals.

The quad switching bit cell may include a tail node, and first and second output nodes. A first p-channel transistor may have a source coupled to the tail node, a drain coupled to the first output node, and a gate biased by the second quad switching control signal. A second p-channel transistor may have a source coupled to the tail node, a drain coupled to the second output node, and a gate biased by the third quad switching control signal. A third p-channel transistor may have a source coupled to the tail node, a drain coupled to the first output node, and a gate biased by the fourth quad switching control signal. A fourth p-channel transistor may have a source coupled to the tail node, a drain coupled to the second output node, and a gate biased by the first quad switching control signal.

The first dynamic latch may be in a reset phase when the clock signal is deasserted. The first and second quad switching control signals may be asserted when the clock signal is deasserted, thereby resetting the first and fourth p-channel transistors when the first dynamic latch is in the reset phase. The second dynamic latch may be in a reset phase when the inverse of the clock signal is deasserted, and the third and fourth quad switching control signals may be asserted when the inverse of the clock signal is deasserted, thereby resetting the second and third p-channel transistors when second dynamic latch is in the reset phase.

The first dynamic latch may include a first p-channel transistor having a source coupled to a supply node, a drain coupled to a first node, and a gate biased by the clock signal. A second p-channel transistor may have a source coupled to the supply node, a drain coupled to the first node, and a gate biased by a second node. A third p-channel transistor may have a source coupled to the supply node, a drain coupled to the second node, and a gate biased by the first node. A fourth p-channel transistor may have a source coupled to the supply node, a drain coupled to the second node, and a gate biased by the clock signal. A first n-channel transistor may have a drain coupled to the first node, a source coupled to a third node, and a gate biased by the second node. A second n-channel transistor may have a drain coupled to the second node, a source coupled to a fourth node, and a gate biased by the first node. A third n-channel transistor may have a drain coupled to the third node, a source coupled to a fifth node, and a gate biased by the data signal. A fourth n-channel transistor may have a drain coupled to the fourth node, a source coupled to the fifth node, and a gate biased by the inverse of the data signal. A fifth n-channel transistor may have a drain coupled to the fifth node, a source coupled to ground, and a gate based by the clock signal.

The first and second quad switching control signals may be respectively generated at the first and second nodes. The third and fourth quad switching control signals may be respectively generated at the third and fourth nodes.

The second dynamic latch may include a first p-channel transistor having a source coupled to a supply node, a drain coupled to a first node, and a gate biased by the inverse of the clock signal. A second p-channel transistor may have a source coupled to the supply node, a drain coupled to the first node, and a gate biased by a second node. A third p-channel transistor may have a source coupled to the supply node, a drain coupled to the second node, and a gate biased by the first node. A fourth p-channel transistor may have a source coupled to the supply node, a drain coupled to the second node, and a gate biased by the inverse of the clock signal. A first n-channel transistor may have a drain coupled to the first node, a source coupled to a third node, and a gate biased by the second node. A second n-channel transistor may have a drain coupled to the second node, a source coupled to a fourth node, and a gate biased by the first node. A third n-channel transistor may have a drain coupled to the third node, a source coupled to a fifth node, and a gate biased by the data signal. A fourth n-channel transistor may have a drain coupled to the fourth node, a source coupled to the fifth node, and a gate biased by the inverse of the data signal. A fifth n-channel transistor may have a drain coupled to the fifth node, a source coupled to ground, and a gate based by the inverse of the clock signal.

A current source may be coupled to the tail node.

DETAILED DESCRIPTION

Figure 1:
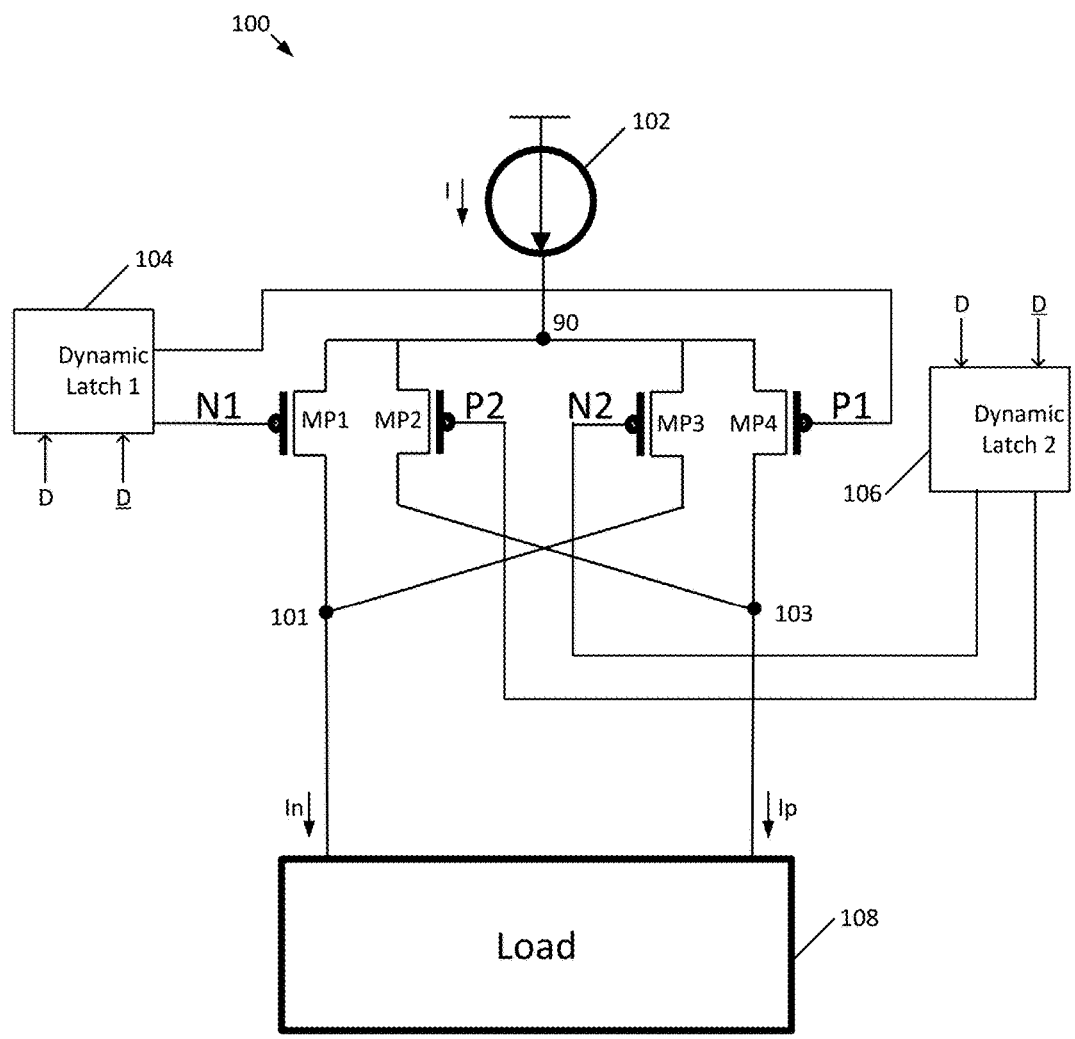
FIG. 1 is a block diagram of a digital to analog converter in accordance with this disclosure.

The drawing figures and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to an analog to digital converter (DAC) utilizing a quad switching scheme turning on or off of switches for steering current to a differential output. The control signals for the quad switching scheme are generated by resettable differential latches. Details will now be given with initial reference to FIG. 1. The DAC 100 includes a current source 102 coupled to a tail node 90. A PMOS transistor MP1 has its source coupled to the tail node 90, its drain coupled to a first output node 101, and its gate biased by a control signal N1 received from a first dynamic latch 104. A PMOS transistor MP2 has its source coupled to the tail node 90, its drain coupled to a second output node 103, and its gate biased by a control signal P2 received from a second dynamic latch 106. A PMOS transistor MP3 has its source coupled to the tail node 90, its drain coupled to the first output node 101, and its gate biased by a control signal N2 from the dynamic latch 106. A PMOS transistor MP4 has its source coupled to the tail node 90, its drain coupled to the second output node 103, and its gate biased by a control signal P1 from the dynamic latch 104. A load 108 is coupled to the first output node 101 and second output node 103. The PMOS transistors MP1-MP4, among things, serve to isolate the load 108 from the current source 102.

Figure 2:
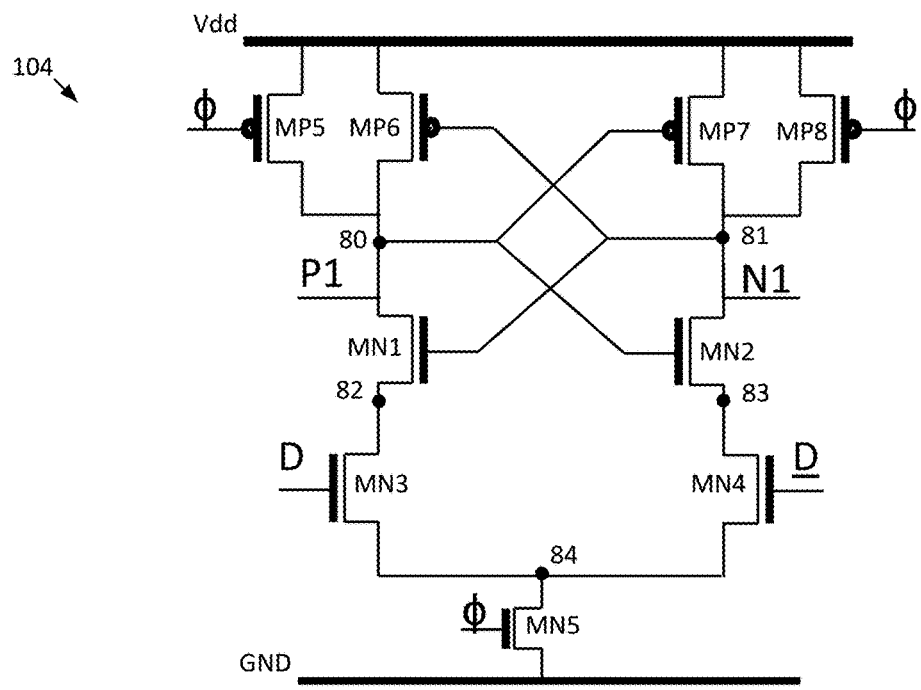
FIG. 2 is a schematic of the first dynamic latch of FIG. 1.

Referring additionally to FIG. 2, the first dynamic latch 104 includes a PMOS transistor MP5 having its source coupled to a supply node Vdd, its drain coupled to node 80, and its gate biased by a clock signal φ. A PMOS transistor MP6 has its source coupled to the supply node Vdd, a drain coupled to node 80, and its gate biased by the voltage at node 81. A PMOS transistor MP7 has its source coupled to the supply node Vdd, its drain coupled to node 81, and its gate biased by the voltage at node 80. A PMOS transistor MP8 has its source coupled to supply node Vdd, its drain coupled to node 81, and its gate biased by the clock signal φ.

A NMOS transistor MN1 has its drain coupled to node 80, its source coupled to node 82, and its gate coupled to be biased by the voltage at node 81. A NMOS transistor MN2 has its drain coupled to node 81, its source coupled to node 83, and its gate coupled to be biased by the voltage at node 80. A NMOS transistor MN3 has its drain coupled to node 82, its source coupled to node 84, and its gate biased by a data signal D. Data signal D is represents a single bit of a multi-bit digital signal received from a digital modulator or OFDM generator that is to be converted to an analog signal representation. Other DACs 100 of the same design of the DAC 100 are used to convert the other bits of the data signal D to analog representations.

An NMOS transistor MN4 has its drain coupled to node 83, its source coupled to node 84, and its gate biased by a logical inverse D of the data signal D. An NMOS transistor MN5 has its drain coupled to node 84, its source coupled to ground, and its gate biased by the clock signal φ.

PMOS transistors MP5 and MP8 operate as precharge transistors. PMOS transistors MP6 and MP7 form a PMOS latch, while NMOS transistors MN1 and MN2 form a NMOS latch that serves to prevent static current. NMOS transistors MN3 and MN4 provide clock data inputs to the dynamic latch 104. The dynamic latch 104 generates the P1 signal at node 80 and the N1 signal at node 81.

Figure 3:
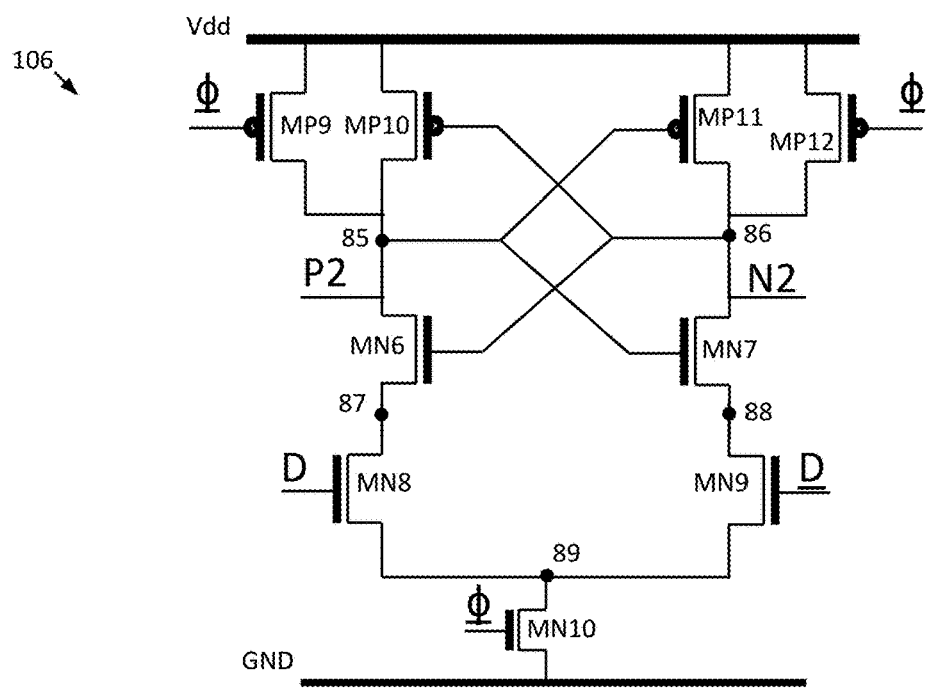
FIG. 3 is a schematic of the second dynamic latch of FIG. 1.

Referring additionally to FIG. 3, the second dynamic latch 106 includes a PMOS transistor MP9 having its source coupled to a supply node Vdd, its drain coupled to node 85, and its gate biased by a logical inverse φ of the clock signal φ. A PMOS transistor MP10 has its source coupled to the supply node Vdd, a drain coupled to node 85, and its gate biased by the voltage at node 85. A PMOS transistor MP11 has its source coupled to the supply node Vdd, its drain coupled to node 85, and its gate biased by the voltage at node 85. A PMOS transistor MP12 has its source coupled to supply node Vdd, its drain coupled to node 86, and its gate biased by the logical inverse φ of the clock signal φ.

An NMOS transistor MN6 has its drain coupled to node 85, its source coupled to node 87, and its gate coupled to be biased by the voltage at node 86. A NMOS transistor MN7 has its drain coupled to node 86, its source coupled to node 88, and its gate coupled to be biased by the voltage at node 85. A NMOS transistor MN8 has its drain coupled to node 87, its source coupled to node 89, and its gate biased by a data signal D. A NOS transistor MN9 has its drain coupled to node 88, its source coupled to node 89, and its gate biased by a logical inverse D of the data signal D. A NMOS transistor MN10 has its drain coupled to node 89, its source coupled to ground, and its gate biased by the logical inverse φ of the clock signal φ.

PMOS transistors MP9 and MP12 operate as precharge transistors. PMOS transistors MP10 and MP11 form a PMOS latch, while NMOS transistors MN6 and MN7 form a NMOS latch that serves to prevent static current. NMOS transistors MN8 and MN9 provide clock data inputs to the dynamic latch 106. The dynamic latch 106 generates the P2 signal at node 80 and the N2 signal at node 81.

It should be understood that FIGS. 1-3 are for one bit (represented by D) of a multi-bit digital signal, and that there will be an equal number of these structures as there are bits in a digital signal to be converterd.

The dynamic latches 104 and 106 may be Strong ARM latched. Details of strong ARM latches can be found in Razavi, "The StrongARM Latch", IEEE Solid-State Circuits Magazine, Spring 2015, which is incorporated by reference herein in its entirety.

Figure 4:
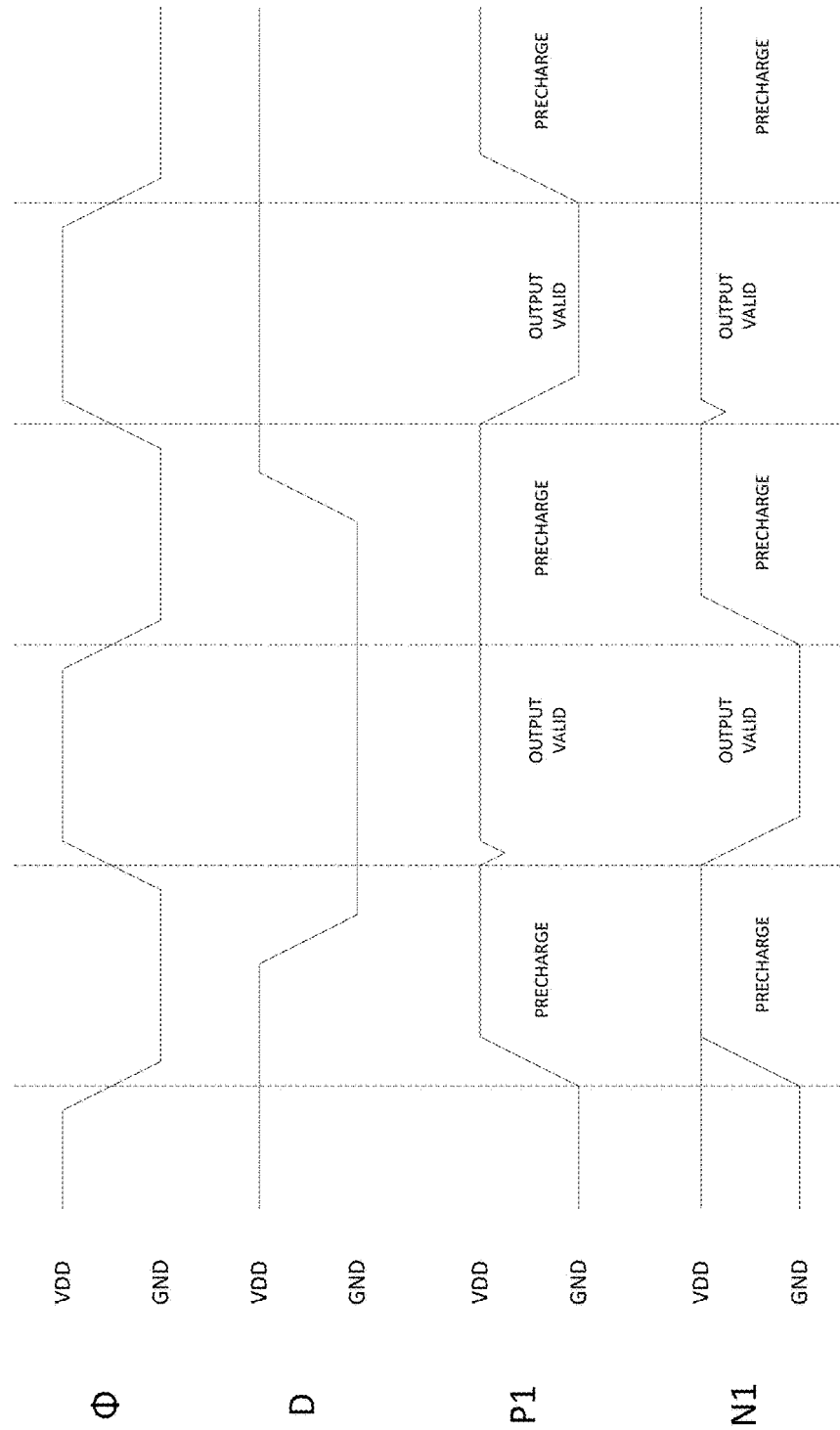
FIG. 4 is a timing diagram of the dynamic latch of FIG. 2 in operation.
Figure 5:
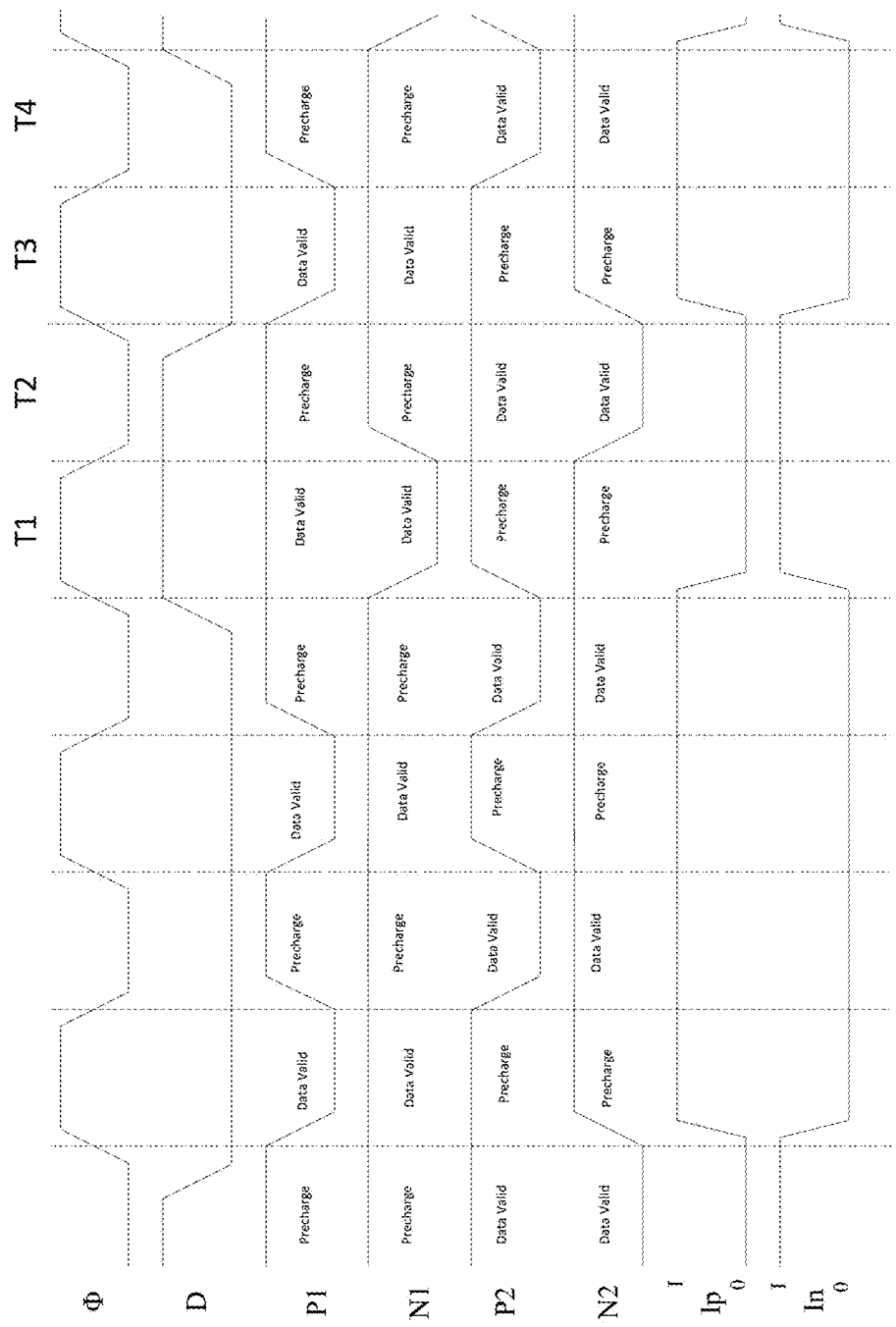
FIG. 5 is a timing diagram of the digital to analog converter of FIG. 1 in operation.

Details of operation of the DAC 100 will now be given with additional reference to FIGS. 4-5. The dynamic latch 104 operates in four phases, namely reset, sampling, regeneration, and output. The reset phase begins when the clock signal ϕ is deasserted. In the reset phase, PMOS transistors MP5 and MP8 turn on, causing the voltage at nodes 80 and 81 to increase to a precharge voltage, outputting signals P1 and N1 as high, as shown in FIG. 4. This turns off PMOS transistors MP6 and MP7, and turns on NMOS transistors MN1 and MN2, causing the voltage at nodes 82 and 83 to increase. NMOS transistor MN5 is turned off when the clock signal ϕ is deasserted. Depending on the value of the data signal D and its inverse D, either NMOS MN3 or MN4 will turn on and charge up node 84 because NMOS transistor MN5 is turned off when the clock signal ϕ is deasserted.

The sampling phase begins when the clock signal ϕ is asserted and continues until one of the PMOS transistors MP6 and MP7 turn on. When the clock signal ϕ goes high, NMOS transistor MN5 turns on, discharging node 84. Depending on the value of the data signal D and its inverse D, one of NMOS transistors MN3 and MN4 will be on, discharging node 82 or 83. NMOS transistors MN1 and MN2 will, at the entry into the sampling phase, be on from the reset phase, and will discharge node 80 or 81, depending on which of the NMOS transistors MN3 and MN4 is on. This will ultimately turn on one of the PMOS transistors MP6 or MP7.

The regeneration phase begins when one of the PMOS transistors MP6 and MP7 turns on, charging node 80 or 81. The output phase begins when the node 80 or 81 being charged is charged to Vdd, and the control signals P1 and N1 are then stable and have a valid output, as shown in FIG. 4.

Operation of the dynamic latch 106 proceeds in the same way as dynamic latch 104, except for the fact that it is clocked by the inverse ϕ of the clock signal ϕ instead of the clock signal ϕ.

The reset phase of the dynamic latch 106 begins when the inverse clock signal ϕ switches low. In the reset phase, PMOS transistors MP9 and MP12 turn on, causing the voltage at nodes 85 and 86 to increase, outputting signals P2 and N2 as high. This turns off PMOS transistors MP10 and MP11, and turns on NMOS transistors MN6 and MN7, causing the voltage at nodes 87 and 88 to increase. NMOS transistor MN10 is turned off when the inverse clock signal ϕ is deasserted. Depending on the value of the data signal D and its inverse D, either NMOS MN8 or MN9 will turn on and charge up node 89 because NMOS transistor MN10 is turned off when the clock signal ϕ is deasserted.

The sampling phase begins when the clock signal ϕ is asserted and continues until one of the PMOS transistors MP10 and MP11 turns on. When the clock signal ϕ goes high, NMOS transistor MN10 turns on, discharging node 89. Depending on the value of the data signal D and its inverse D, one of NMOS transistors MN8 and MN9 will be on, discharging node 87 or 88. NMOS transistors MN6 and MN7 will, at the entry into the sampling phase, be on from the reset phase, and will discharge node 85 or 86, depending on which of the NMOS transistors MN8 and MN9 is on. This will ultimately turn on one of the PMOS transistors MP10 or MP11.

The regeneration phase begins when one of the PMOS transistors MP10 and MP11 turns on, charging node 85 or 86. The output phase begins when the node 85 or 86 being charged is charged to Vdd, and the control signals P2 and N2 are then stable ready to be read.

Referring now to the timing diagram of FIG. 4, as an example, at time T1, the clock ϕ is high, and the data signal D is high. Thus, the dynamic latch 104 generates P1 as high and N1 as low, and the dynamic latch 104 generates P2 and N2 as high. Consequently, as explained, only the transistor MP1 is on while the other transistors MP2-MP4 are off. At time T2, the clock ϕ is low, and the data signal D is still high. It should be noted that the frequency of the data signal D matches that of the clock ϕ. Then, the dynamic latch 104 is in its reset phase and generates P1 and N1 as high, and the dynamic latch 106 generates P2 as high and N2 as low, turning MP3 on, while transistors MP1-MP2 and MP4 are off. Next, at time T3, the clock ϕ is high again, and the data signal D is low. Thus, the dynamic latch 104 generates P1 as low and N1 as high, while dynamic latch 106 generates P2 and N2 as high, turning transistor MP1 on, while transistors MP2-MP4 are off.

Thus, from the description of the operation of the first and second dynamic latches 104 and 106 above, it should be apparent that in a clock cycle, the control signals P1, N1, P2, N2 control the transistors MP1, MP2, MP3, and MP4 such that one of the four is turned on whereas other three are turned off. In a subsequent clock cycle, a different transistor MP1, MP2, MP3, or MP4 is turned on while the transistor MP1, MP2, MP3, or MP4 activated in a previous cycle is turned off. The transistor MP1, MP2, MP3, or MP4 to be turned on in a next cycle is one of two transistors MP1, MP2, MP3, or MP4 adjacent to the transistor MP1, MP2, MP3, or MP4 that was turned on in a previous cycle. Even if the current source 102 should remain connected to the same output node 101 or 103 during two adjacent clock cycles, the activated transistor MP1, MP2, MP3, or MP4 is shifted between the two clock cycles.

The logic of the DAC 100 can be summed up as thus. Current In will equal current I when P1=P2=1 and either N1 or N2=0. Current Ip will equal current I when N1=N2=1 and either P1 or P2=0. Other operating states do not occur.

Further details of such a quad switching scheme can be found in Sungkyung Park et al., "A Digital-to-Analog Converter Based on Differential-Quad Switching," IEEE Journal of Solid-State Circuits, vol. 38, No. 10 (October 2002), which is incorporated by reference herein in its entirety.

Through the use of the quad switching coupled with the use of the dynamic latches 104 and 106 instead of decoders, as well as the fact that the reset phase of the dynamic latches 104 and 106 overlaps with reset of the transistors MP1-MP4, data dependent noise is reduced or removed. Moreover, the complete symmetry of the design of the DAC 100 helps ensure that only clock frequency dependent ripples appear on the power supply. This is particularly advantageous because switching performance in a DAC 100 is crucial to the linearity of the performance of the DAC 100 itself. Imperfections in the data signal such as jitter, amplitude noise, and poor pulse width control can degrade DAC performance. By imparting the data signal with the clean characteristics of a clock, and doing so as physically close to the switching circuitry as possible with the least amount of circuitry involved, these deficiencies are greatly reduced.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

The invention claimed is:

1. A digital to analog converter, comprising:
a first dynamic latch coupled to a first node to receive a data signal and coupled to a second node to receive an inverse of the data signal, the first dynamic latch being clocked by a clock signal and configured to generate first and second quad switching control signals as a function of the data signal and the inverse of the data signal;
a second dynamic latch coupled to the first node to receive the data signal and coupled to the second node to receive the inverse of the data signal, the second dynamic latch being clocked by an inverse of the clock signal and configured to generate third and fourth quad switching control signals as a function of the data signal and the inverse of the data signal; and
a quad switching bit cell configured to generate an analog representation of the data signal as a function of the first, second, third, and fourth quad switching control signals;
wherein the quad switching bit cell includes first, second, third, and fourth transistors respectively controlled by the first, second, third, and fourth quad switching control signals; and
wherein the first, second, third, and fourth quad switching control signals are generated by the first and second dynamic latches such that one of the first, second, third, and fourth transistors is on while a remainder are off during each cycle of the clock signal.

2. The digital to analog converter of claim 1, wherein the quad switching bit cell comprises:
a tail node;
first and second output nodes;
wherein the first transistor comprises a first p-channel transistor having a source coupled to the tail node, a drain coupled to the first output node, and a gate biased by the second quad switching control signal;
wherein the second transistor comprises a second p-channel transistor having a source coupled to the tail node, a drain coupled to the second output node, and a gate biased by the third quad switching control signal;
wherein the third transistor comprises a third p-channel transistor having a source coupled to the tail node, a drain coupled to the first output node, and a gate biased by the fourth quad switching control signal; and
wherein the fourth transistor comprises a fourth p-channel transistor having a source coupled to the tail node, a drain coupled to the second output node, and a gate biased by the first quad switching control signal.

3. The digital to analog converter of claim 2, wherein the first dynamic latch is in a reset phase when the clock signal is deasserted; and wherein the first and second quad switching control signals are asserted when the clock signal is deasserted, thereby resetting the first and fourth p-channel transistors when the first dynamic latch is in the reset phase.

4. The digital to analog converter of claim 2, wherein the second dynamic latch is in a reset phase when the inverse of the clock signal is deasserted; and wherein the third and fourth quad switching control signals are asserted when the inverse of the clock signal is deasserted, thereby resetting the second and third p-channel transistors when the second dynamic latch is in the reset phase.

5. The digital to analog converter of claim 2, further comprising a current source coupled to the tail node.

6. The digital to analog converter of claim 1, wherein the first dynamic latch comprises:
a first p-channel transistor having a source coupled to a supply node, a drain coupled to a first node, and a gate biased by the clock signal;
a second p-channel transistor having a source coupled to the supply node, a drain coupled to the first node, and a gate biased by a second node;
a third p-channel transistor having a source coupled to the supply node, a drain coupled to the second node, and a gate biased by the first node;
a fourth p-channel transistor having a source coupled to the supply node, a drain coupled to the second node, and a gate biased by the clock signal;
a first n-channel transistor having a drain coupled to the first node, a source coupled to a third node, and a gate biased by the second node;
a second n-channel transistor having a drain coupled to the second node, a source coupled to a fourth node, and a gate biased by the first node;
a third n-channel transistor having a drain coupled to the third node, a source coupled to a fifth node, and a gate biased by the data signal;
a fourth n-channel transistor having a drain coupled to the fourth node, a source coupled to the fifth node, and a gate biased by the inverse of the data signal;
a fifth n-channel transistor having a drain coupled to the fifth node, a source coupled to ground, and a gate based by the clock signal.

7. The digital to analog converter of claim 6, wherein the first and second quad switching control signals are respectively generated at the first and second nodes.

8. The digital to analog converter of claim 6, wherein the third and fourth quad switching control signals are respectively generated at the third and fourth nodes.

9. The digital to analog converter of claim 1, wherein the second dynamic latch comprises:
a first p-channel transistor having a source coupled to a supply node, a drain coupled to a first node, and a gate biased by the inverse of the clock signal;
a second p-channel transistor having a source coupled to the supply node, a drain coupled to the first node, and a gate biased by a second node;
a third p-channel transistor having a source coupled to the supply node, a drain coupled to the second node, and a gate biased by the first node;
a fourth p-channel transistor having a source coupled to the supply node, a drain coupled to the second node, and a gate biased by the inverse of the clock signal;
a first n-channel transistor having a drain coupled to the first node, a source coupled to a third node, and a gate biased by the second node;
a second n-channel transistor having a drain coupled to the second node, a source coupled to a fourth node, and a gate biased by the first node;

a third n-channel transistor having a drain coupled to the third node, a source coupled to a fifth node, and a gate biased by the data signal;

a fourth n-channel transistor having a drain coupled to the fourth node, a source coupled to the fifth node, and a gate biased by the inverse of the data signal;

a fifth n-channel transistor having a drain coupled to the fifth node, a source coupled to ground, and a gate based by the inverse of the clock signal.

10. A digital to analog converter, comprising:

a first resettable differential latch coupled to a first node to receive a data signal and coupled to a second node to receive an inverse of the data signal, the first resettable differential latch configured to generate first and second quad switching control signals as a function of the data signal and the inverse of the data signal;

a second resettable differential latch coupled to a first node to receive the data signal and coupled to the second node to receive the inverse of the data signal, the second resettable differential latch configured to generate third and fourth quad switching control signals as a function of the data signal and the inverse of the data signal;

a quad switching converter controlled by the first, second, third, and fourth quad switching control signals and configured to generate an analog representation of the data signal;

wherein the quad switching converter includes first, second, third, and fourth transistors respectively controlled by the first, second, third, and fourth quad switching control signals; and wherein the first, second, third, and fourth quad switching control signals are generated by the first and second resettable differential latches such that one of the first, second, third, and fourth transistors is on while a remainder are off during each cycle of the data signal.

11. The digital to analog converter of claim 10, wherein the first resettable differential latch comprises a first dynamic latch.

12. The digital to analog converter of claim 10, wherein the second resettable differential latch comprises a second dynamic latch.

13. The digital to analog converter of claim 10,
wherein the first and second transistors are configured to generate the analog representation of the data signal on first and second output nodes; and
wherein the first and second transistors are configured to be reset when the first resettable differential latch is reset.

14. The digital to analog converter of claim 13,
wherein the third and fourth transistors are configured to generate the analog representation of the data signal on the first and second output nodes; and
wherein the third and fourth transistors are configured to be reset when the second resettable differential latch is reset.

15. A method, comprising:
receiving a data signal at a first resettable differential latch;
generating first and second quad switching control signals as a function of the data signal, using the first resettable differential latch;
receiving the data signal at a second resettable differential latch;
generating third and fourth quad switching control signals as a function of the data signal, using the second resettable differential latch;
generating an analog representation of the data signal using a quad switching digital to analog architecture as a function of the first, second, third, and fourth quad switching control signals by:
resetting a first pair of transistors of a quad switching digital to analog architecture concurrently with resetting the first resettable differential latch,
resetting a second pair of transistors of the quad switching digital to analog architecture concurrently with resetting the second resettable differential latch,
generating the analog representation of the data signal by switching the second pair of transistors according to the third and fourth quad switching control signals while the first pair of transistors and first resettable differential latch are being reset, and
generating the analog representation of the data signal by switching the first pair of transistors according to the first and second quad switching control signals while the second pair of transistors and second resettable differential latch are being reset.

* * * * *